United States Patent
Ching et al.

(10) Patent No.: US 9,991,262 B1
(45) Date of Patent: Jun. 5, 2018

(54) SEMICONDUCTOR DEVICE ON HYBRID SUBSTRATE AND METHOD OF MANUFACTURING THE SAME

(71) Applicant: TAIWAN SEMICONDUCTOR MANUFACTURING CO., LTD., Hsinchu (TW)

(72) Inventors: Kuo-Cheng Ching, Hsinchu County (TW); Ching-Wei Tsai, Hsinchu (TW); Kuan-Lun Cheng, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/623,499

(22) Filed: Jun. 15, 2017

(51) Int. Cl.
*H01L 27/092* (2006.01)
*H01L 29/78* (2006.01)
*H01L 29/04* (2006.01)
*H01L 29/06* (2006.01)
*H01L 29/161* (2006.01)
*H01L 29/66* (2006.01)
*H01L 21/8238* (2006.01)

(52) U.S. Cl.
CPC .. *H01L 27/0924* (2013.01); *H01L 21/823821* (2013.01); *H01L 21/823878* (2013.01); *H01L 29/045* (2013.01); *H01L 29/0642* (2013.01); *H01L 29/161* (2013.01); *H01L 29/66553* (2013.01); *H01L 29/66795* (2013.01); *H01L 29/785* (2013.01)

(58) Field of Classification Search
CPC ........... H01L 27/0924; H01L 29/66795; H01L 29/785; H01L 29/045; H01L 29/66553
See application file for complete search history.

(56) References Cited

U.S. PATENT DOCUMENTS

| | | | |
|---|---|---|---|
| 8,796,666 B1 | 8/2014 | Huang et al. | |
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 2016/0064485 A1* | 3/2016 | Weng | H01L 29/1054 257/77 |
| 2016/0211263 A1* | 7/2016 | Goel | H01L 29/785 |
| 2016/0308032 A1* | 10/2016 | Glass | H01L 29/66795 |

* cited by examiner

*Primary Examiner* — Walter H Swanson
(74) *Attorney, Agent, or Firm* — McClure, Qualey & Rodack, LLP

(57) ABSTRACT

A semiconductor device includes PMOS and NMOS FinFET devices disposed on a hybrid substrate including a first substrate and a second substrate, in which a fin of the PMOS FinFET device is formed on the first substrate having a top surface with a (100) crystal orientation, and another fin of the NMOS FinFET device is formed on the second substrate having a top surface with a (110) crystal orientation. The semiconductor device further includes a capping layer enclosing a buried bottom portion of the fin of the PMOS FinFET device, and another capping layer enclosing an effective channel portion of the fin of the PMOS FinFET device.

20 Claims, 21 Drawing Sheets

SEMICONDUCTOR DEVICE ON HYBRID SUBSTRATE AND METHOD OF MANUFACTURING THE SAME

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

As the semiconductor IC industry has progressed into nanometer technology process nodes in pursuit of higher device density, higher performance, and lower costs, challenges from both fabrication and design have resulted in the development of three-dimensional (3D) devices such fin-like field effect transistors (FinFETs). Advantages of FinFET devices include reducing the short channel effect and higher current flow. There has been a desire to use a FinFET device with a high-k gate dielectric and metal gate electrode to improve device performance as feature sizes continue to decrease. A n-type MOS (NMOS) device and a p-type MOS (PMOS) device require different sidewall crystalline orientations to enhance their electron mobility and hole mobility respectively, and a hybrid substrate scheme is presented to meet the requirement. However, conventional hybrid substrate schemes having fins with different sidewall crystalline orientations have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
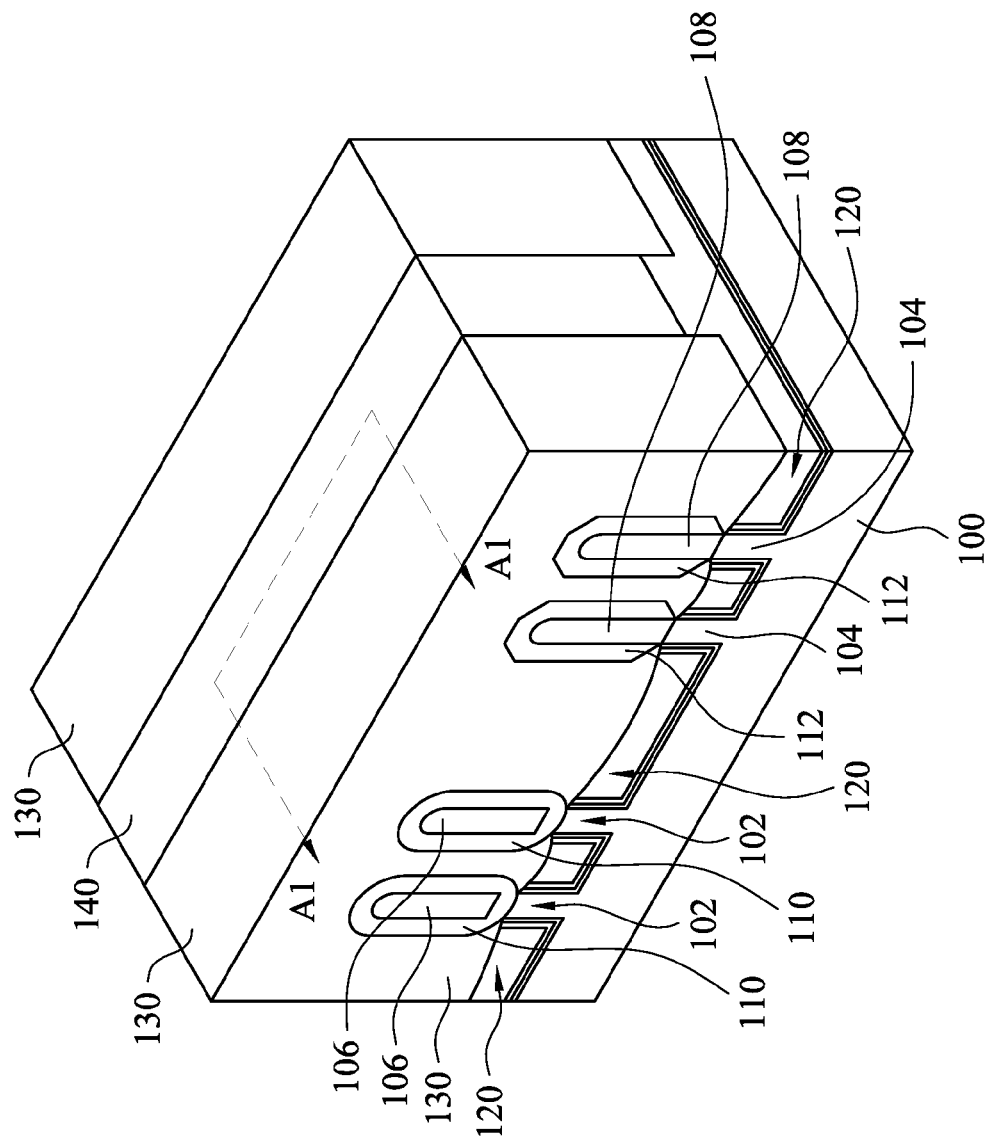
FIG. 1A is a schematic isometric view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "high-k" refers to a high dielectric constant. In the field of semiconductor device structures and manufacturing processes, high-k refers to a dielectric constant that is greater than the dielectric constant of SiO2 (e.g., greater than 3.9).

As used herein, the term "p-type" defines any structure, layer, and/or region as being doped with p-type dopants, such as, for example, boron.

As used herein, the term "n-type" defines any structure, layer, and/or region as being doped with n-type dopants, such as, for example, phosphorus.

Typically, a (110) crystal orientation surface is good for channel hole mobility but poor for channel electron mobility, while the (100) crystal orientation surface is poor for channel hole mobility but good for channel electron mobility. Thus, a (110) sidewall orientation is a preferred orientation for PMOS FinFET device and a (100) sidewall orientation is a preferred orientation for NMOS FinFET device. Embodiments of the present disclosure are directed to providing desirable surface orientations for PMOS and NMOS FinFET devices on a hybrid substrate including a first substrate and a second substrate, in which a fin of the PMOS FinFET device is formed on the first substrate having a top surface with a (100) crystal orientation and a sidewall with a (110) crystal orientation, and another fin of the NMOS FinFET device is formed on the second substrate having a top surface with a (110) crystal orientation and a sidewall with a (100) crystal orientation. Embodiments of the present disclosure further forms a capping layer to enclose a buried bottom portion of the fin of the PMOS FinFET device for improving the interface state density (Dit), and forms another capping layer to enclose an effective channel portion of the fin of the PMOS FinFET device for improving the gate dielectric/semiconductor interface, in which a height of effective channel portion of the fin of the PMOS FinFET device is about equal to that of the fin of the NMOS FinFET device, thereby overcoming the fin height loss issue and degraded performance (such as capacitor loss).

Referring to FIG. 1A, FIG. 1A is a schematic cross-sectional view of a semiconductor device in accordance with embodiments. As shown in FIG. 1A, the semiconductor device includes a substrate 100, at least one first lower fin 102 and at least one second lower fin 104 protruding from the substrate 100, trench isolations 120, at least one first upper fin 106 each of which is enclosed by a first drain/source expitaxy layer 110, at least one second upper fin 108 each of which adjoins a top of the second lower fin 104 and is enclosed by a second drain/source expitaxy layer 112, a gate stack 140 crossing the first upper fin 106 and the upper SiGe fin 108; an isolation layer 130 that covers the first upper fin 106 and the second upper fin 108, and sandwiches the gate stack 140. One of the trench isolations 120 is disposed between the first lower fin 102 and the second lower fin 104 and surrounding the first lower fin and the second lower fin. Some trench isolations 120 are disposed between the first lower fins 102 and between the second lower fins 104. The first drain/source expitaxy layer 110 is disposed on each of both sides of the gate stack 140 on the first upper fin 106, encloses the first upper fin 106 and is disposed between the first lower fin 102 and the first upper fin 104, thereby providing good transistor performance.

The lower fins 102 and 104 may be patterned by any suitable method. For example, the lower fins 102 and 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the lower fins 102 and 104.

The substrate 100 has a top surface with a first crystal orientation, and thus the first lower fin 102 and the second lower fin 104 also have top surfaces with the first crystal orientation. The second upper fin 108 is grown from the second lower fin 104, and thus also has a top surface with the first crystal orientation. The first upper fin has a top surface with a second crystal orientation different from the first crystal orientation. For example, the first crystal orientation is a (100) crystal orientation, and the second crystal orientation is a (110) crystal orientation. The substrate 100a is a silicon substrate with a (100) crystal orientation top surface, and the first lower fin 102 and the second lower fin 104 have (100) crystal orientation top surfaces. The first upper fin 106 is a silicon fin with a (110) crystal orientation top surface which has a (100) crystal orientation sidewall good for forming a NMOS device. The second upper fin 108 is a silicon germanium (SiGe) expitaxy layer with a (100) crystal orientation top surface which has a (110) crystal orientation sidewall good for forming a PMOS device.

Figure 1B:
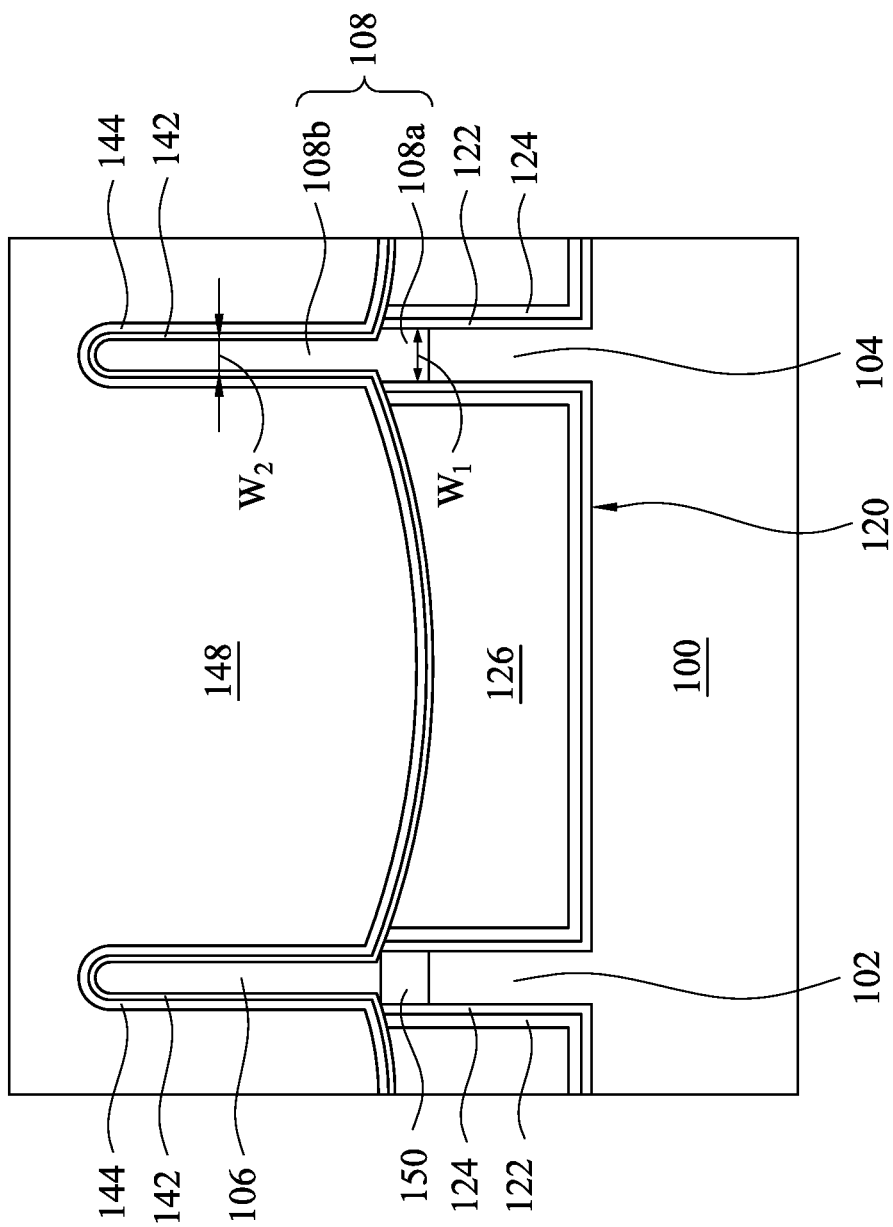
FIG. 1B is a schematic cross-sectional views of the semiconductor device viewed along line A1-A1 of FIG. 1A.

Referring to FIG. 1B, FIG. 1B is a schematic cross-sectional views of the semiconductor device viewed along line A-A of FIG. 1A. As shown in FIG. 1B, an isolator layer (such as silicon oxide) 150 is disposed between the first lower fin 102 and the first upper fin 106. The second upper fin 108 has a first portion 108a and a second portion 108b adjoining a top of the first portion 108a. A height (fin height) of the first upper fin 106 is substantially equal to a height (fin height) of the second portion 108b of the second upper fin 108, thus providing good FinFET performance. In the trench isolations 120, a first capping liner 122 is disposed conformally over sidewalls of the first lower fin 102 and the isolator layer 150, sidewalls of the second lower fin 104 and the first portion of the second upper fin, and top surfaces of the substrate, and an isolation filler (such as silicon oxide) 126 is peripherally enclosed by the first capping liner. The first portion 108a of the second upper fin 108 is buried among the trench isolations 120, and is further protected by the first capping liner 122 to improve the interface state density (Dit), thus preventing leakage problems from occurring. In some examples, the first capping liner 122 is formed from silicon, i.e. a silicon layer. Due to the results of the fabrication of the present disclosure that will be described later, a width W1 of the first portion 108a of the second upper fin 108 is greater than a width W2 of the second portion 108b of the second upper fin 108. In some examples, a width difference (W1-W2) between the first portion 108a of the second upper fin 108 and the second portion 108b of the second upper fin 108 is substantially in a range from 1 nm to 3 nm.

In addition, a second capping liner 142 is disposed conformally over the first upper fin 106, the second upper fin 108 and a top surface of the trench isolations 120, thereby preventing leakage problems from occurring. In some examples, the second capping liner 142 is formed from silicon, i.e. a silicon layer. A thickness of the first capping liner 122 is greater than a thickness of the second capping liner 142. In some examples, a thickness difference between the first capping liner 122 and the second capping liner 142 is substantially in a range from 0.5 nm to 2 nm.

In some embodiments, a nitride layer 124 is formed over the first capping liner 122. In the gate stack 140, a dielectric layer (such as a high-k dielectric layer) 144 is formed over the second capping layer 142, and a gate layer 148 (such as a metal gate) is formed over the dielectric layer 144.

Figure 2A:
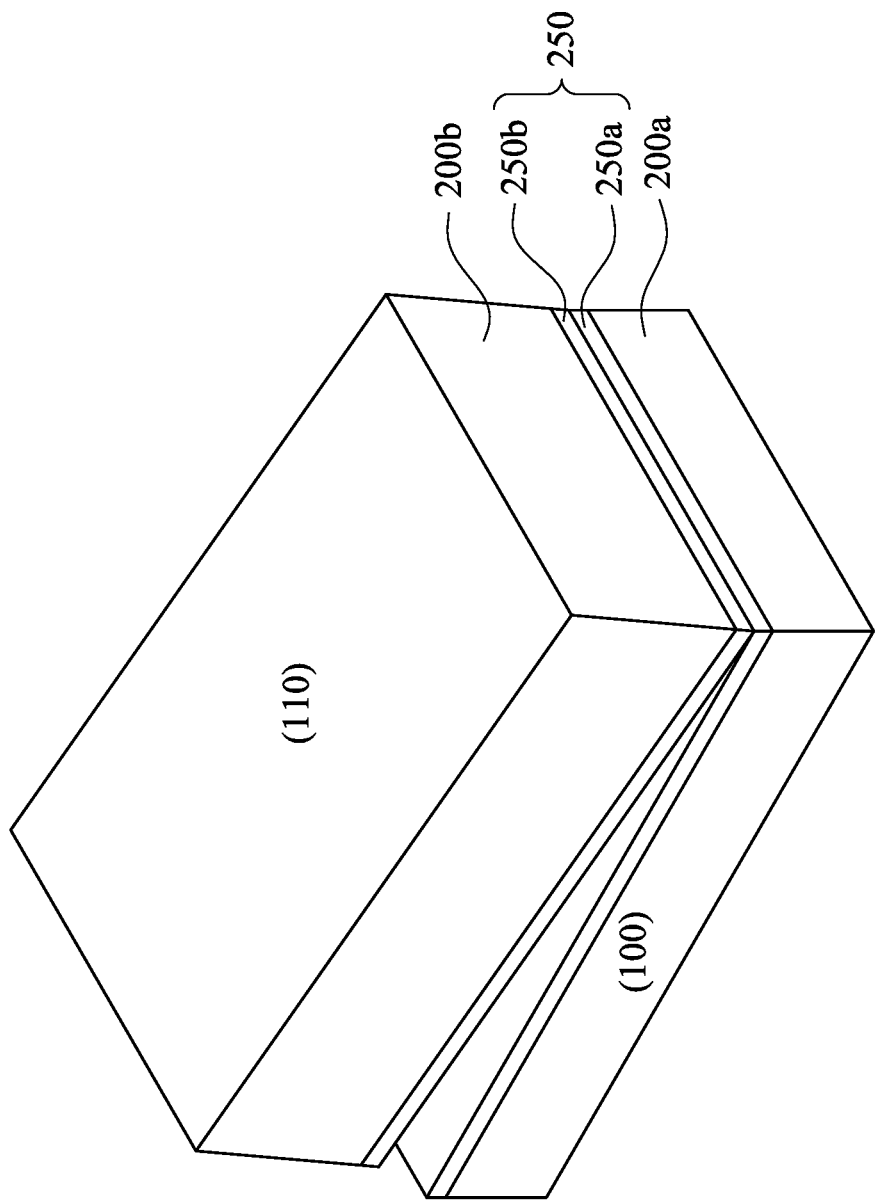
FIG. 2A to FIG. 2O are schematic cross-sectional views of intermediate stages showing a method of fabricating a semiconductor device in accordance with various embodiments.
Figure 2B:
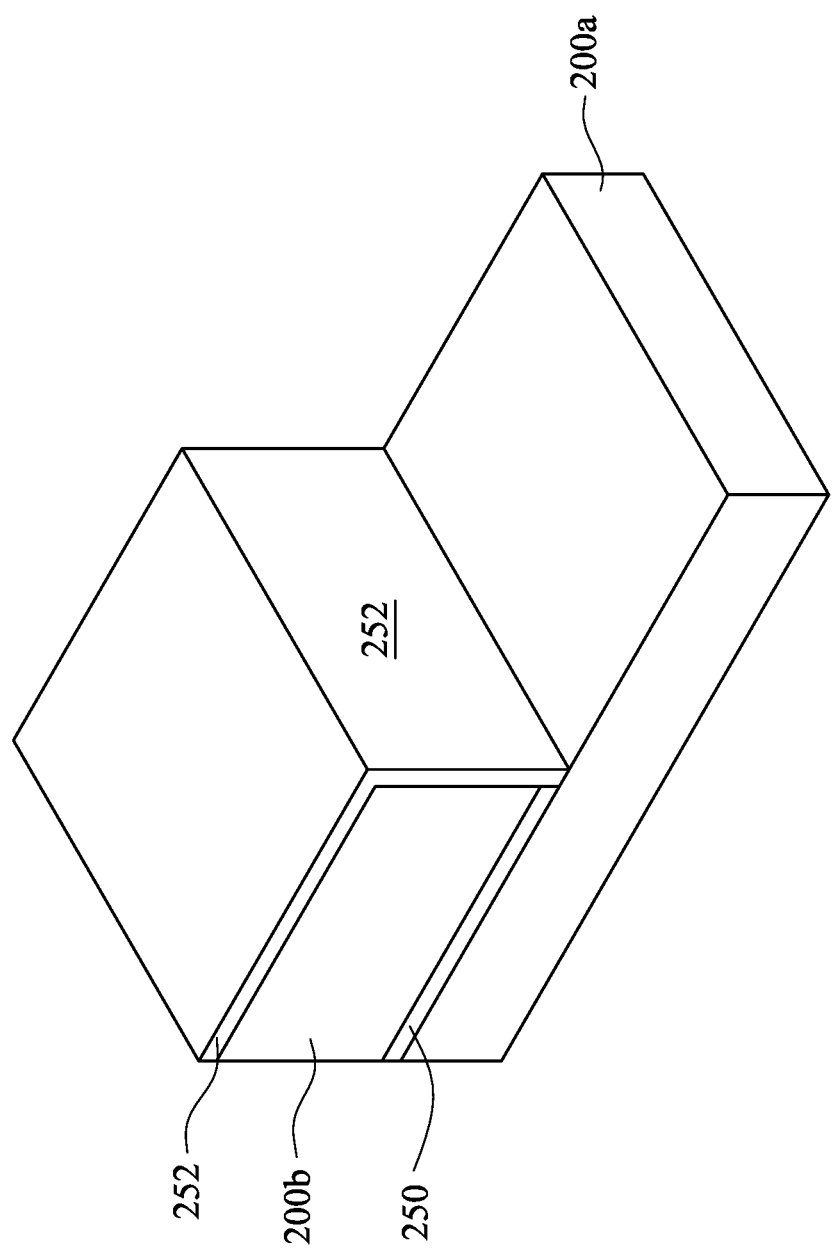
FIG. 2P is a schematic cross-sectional views of the semiconductor device viewed along line B1-B1 of FIG. 2O.
Figure 2C:
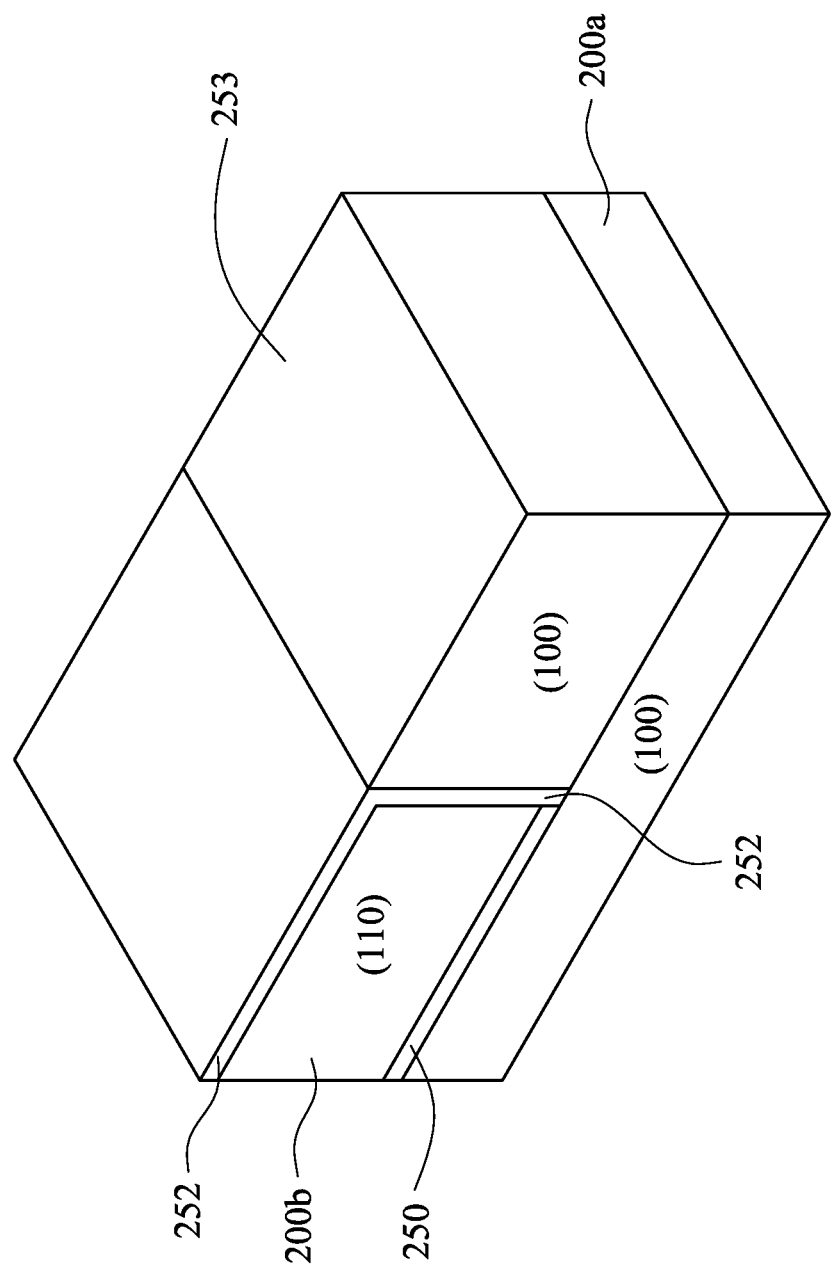
Figure 2D:
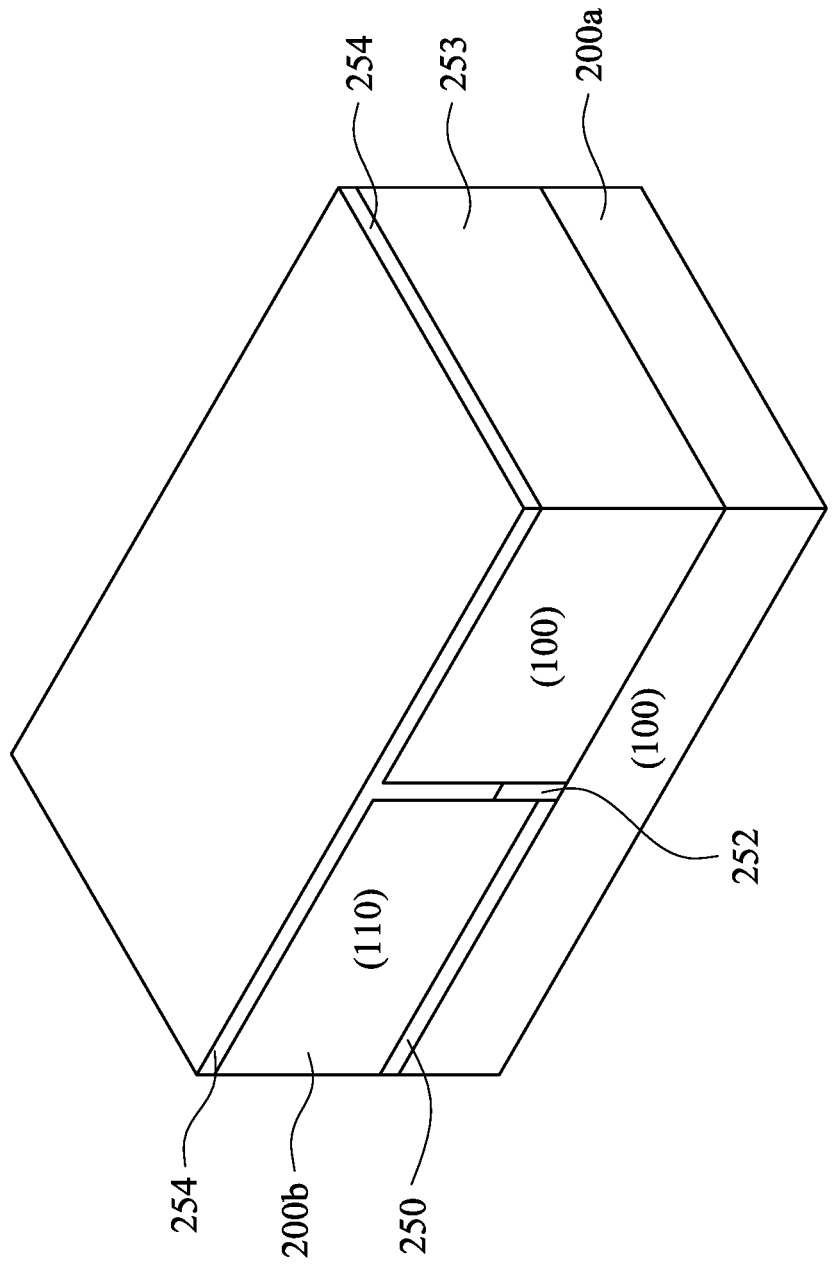
Figure 2E:
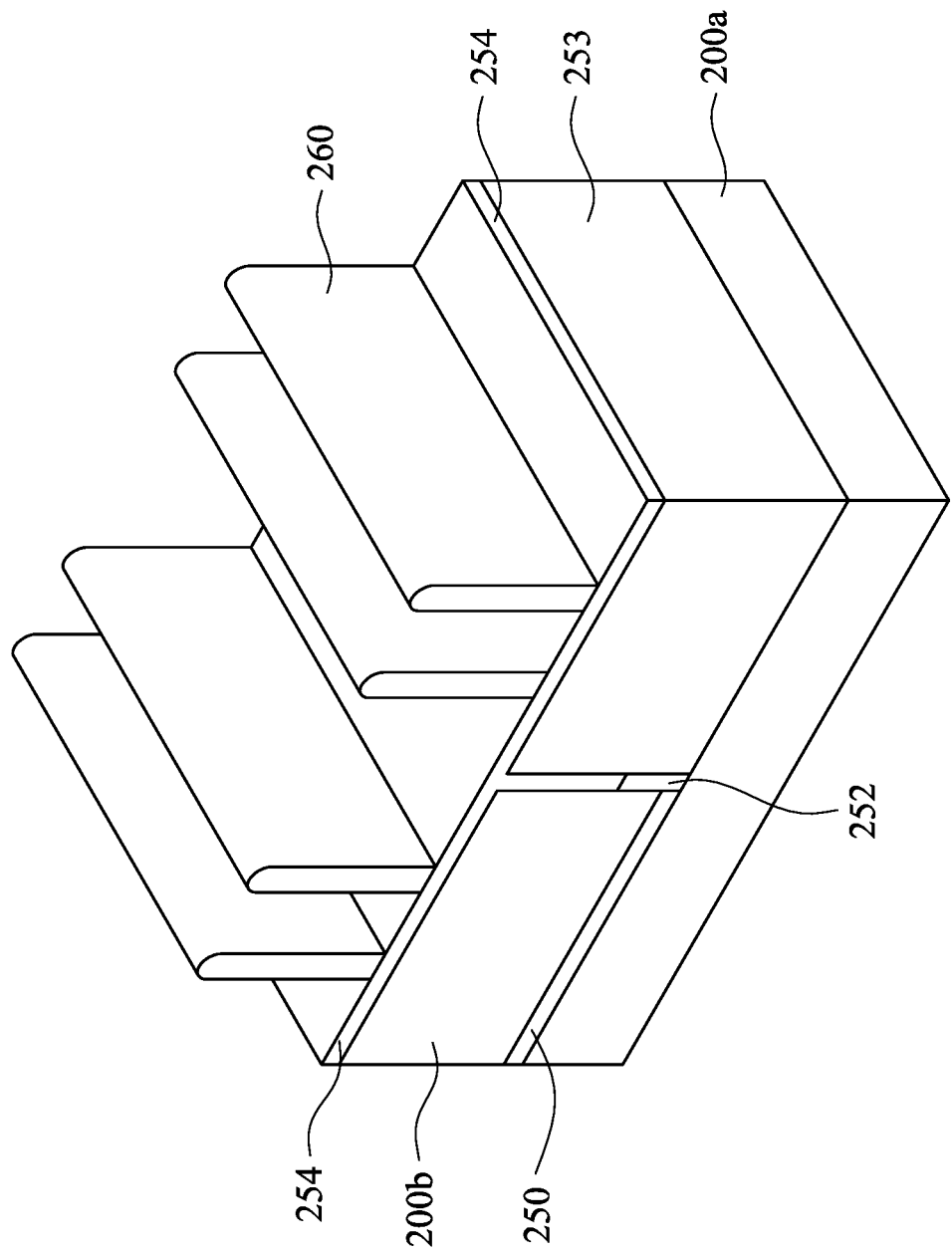
Figure 2F:
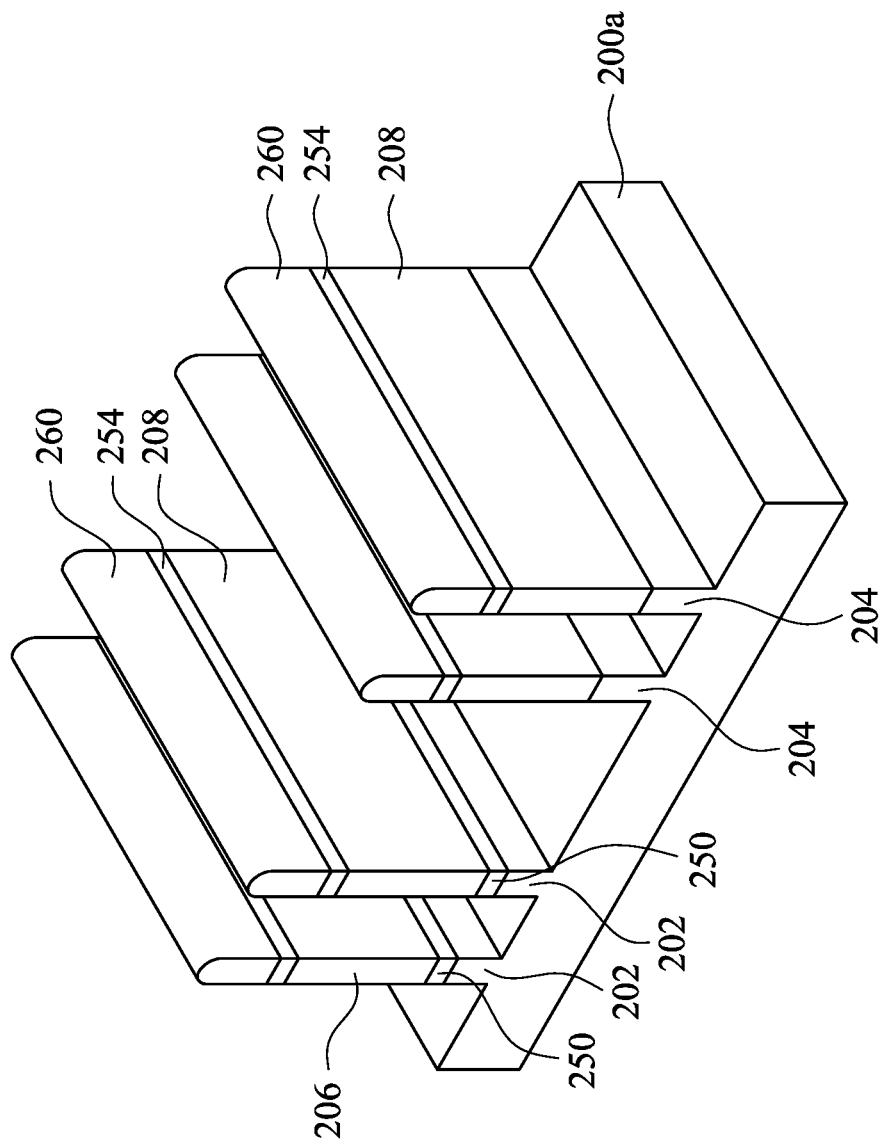
Figure 2G:
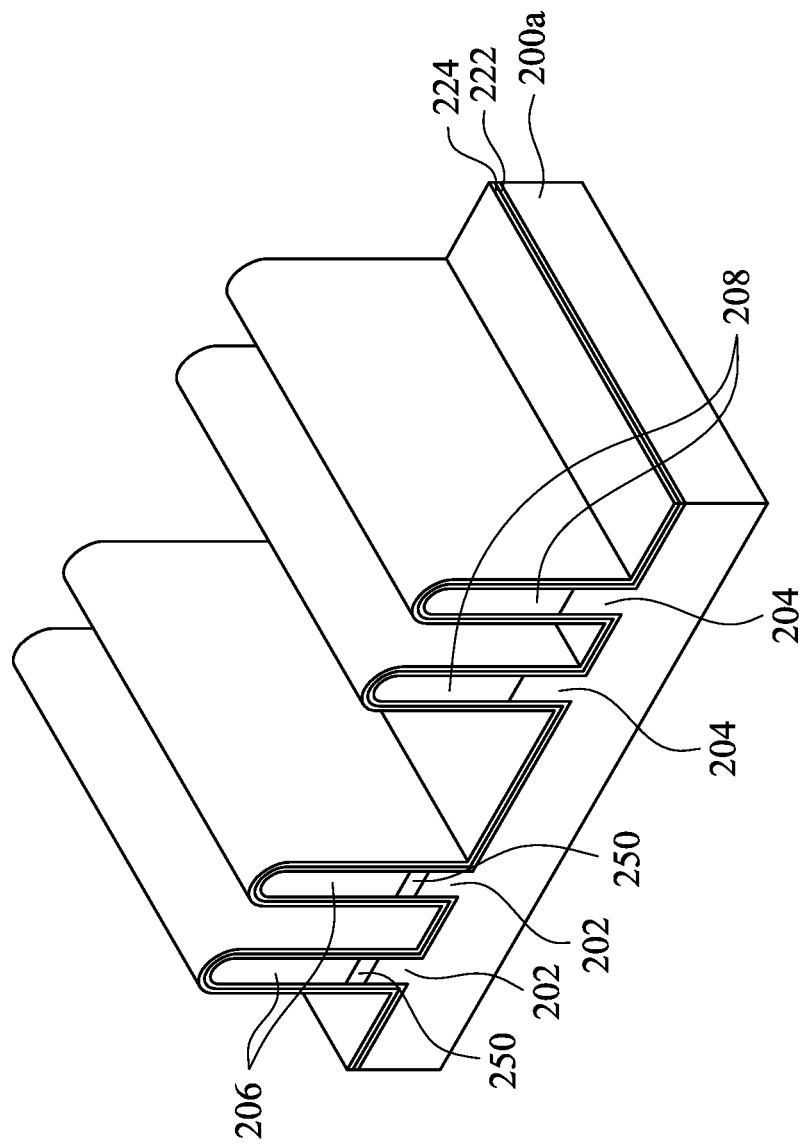
Figure 2H:
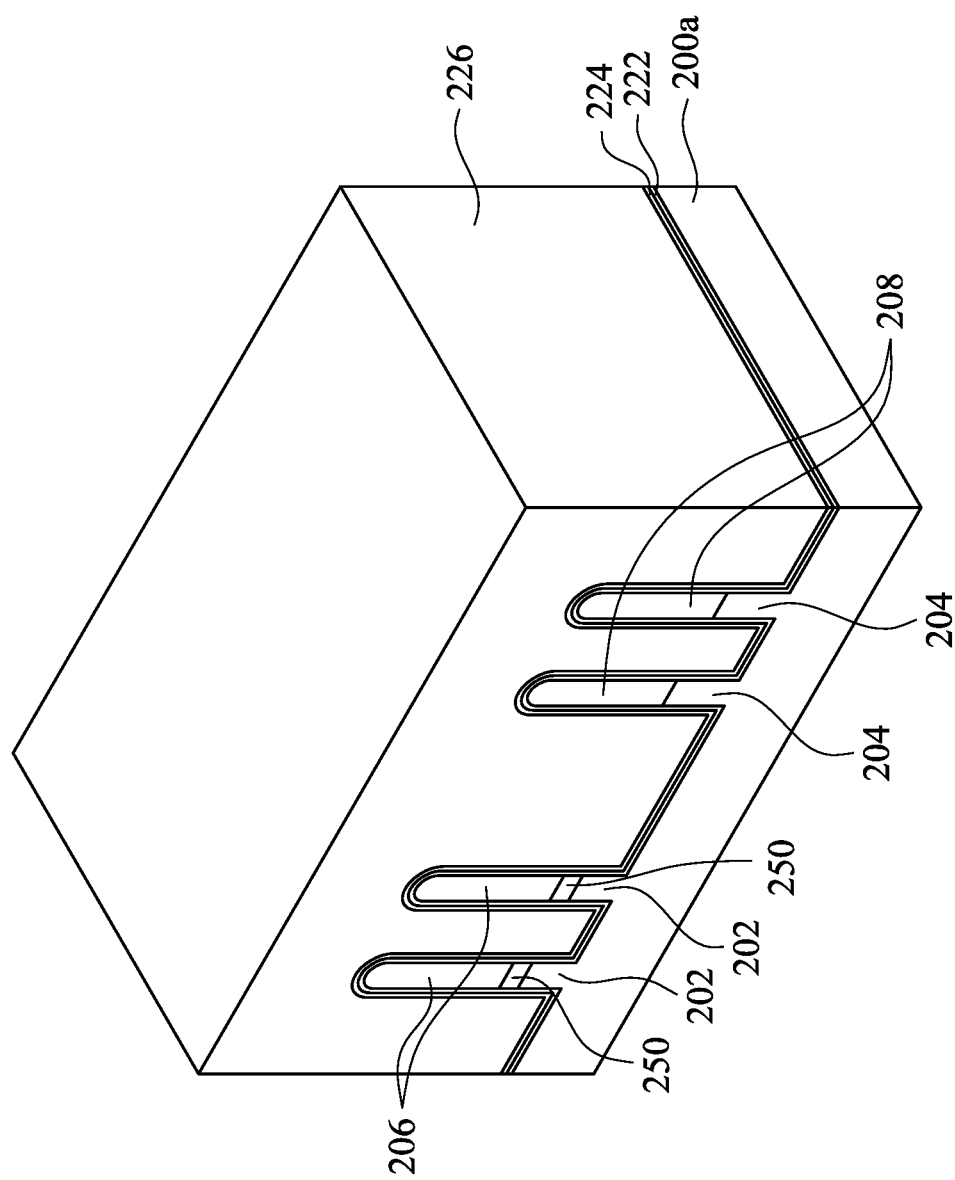
Figure 2I:
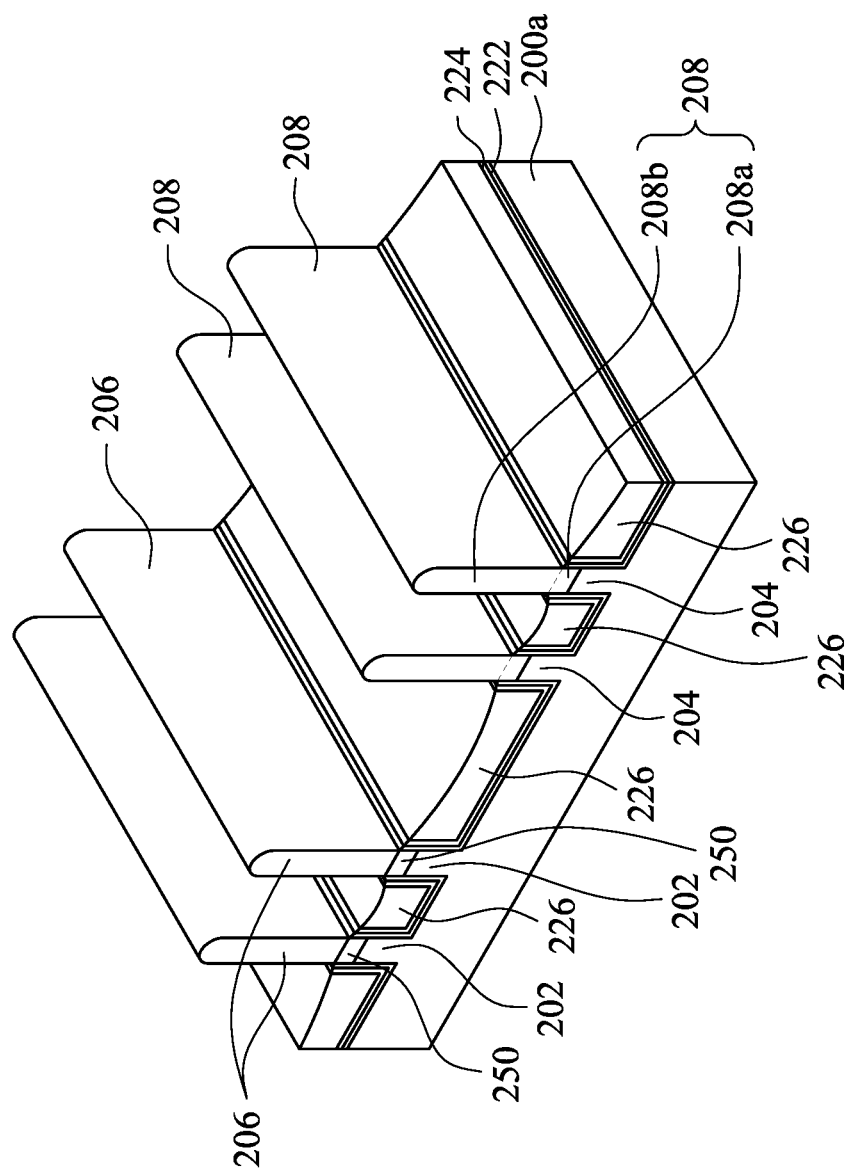
Figure 2J:
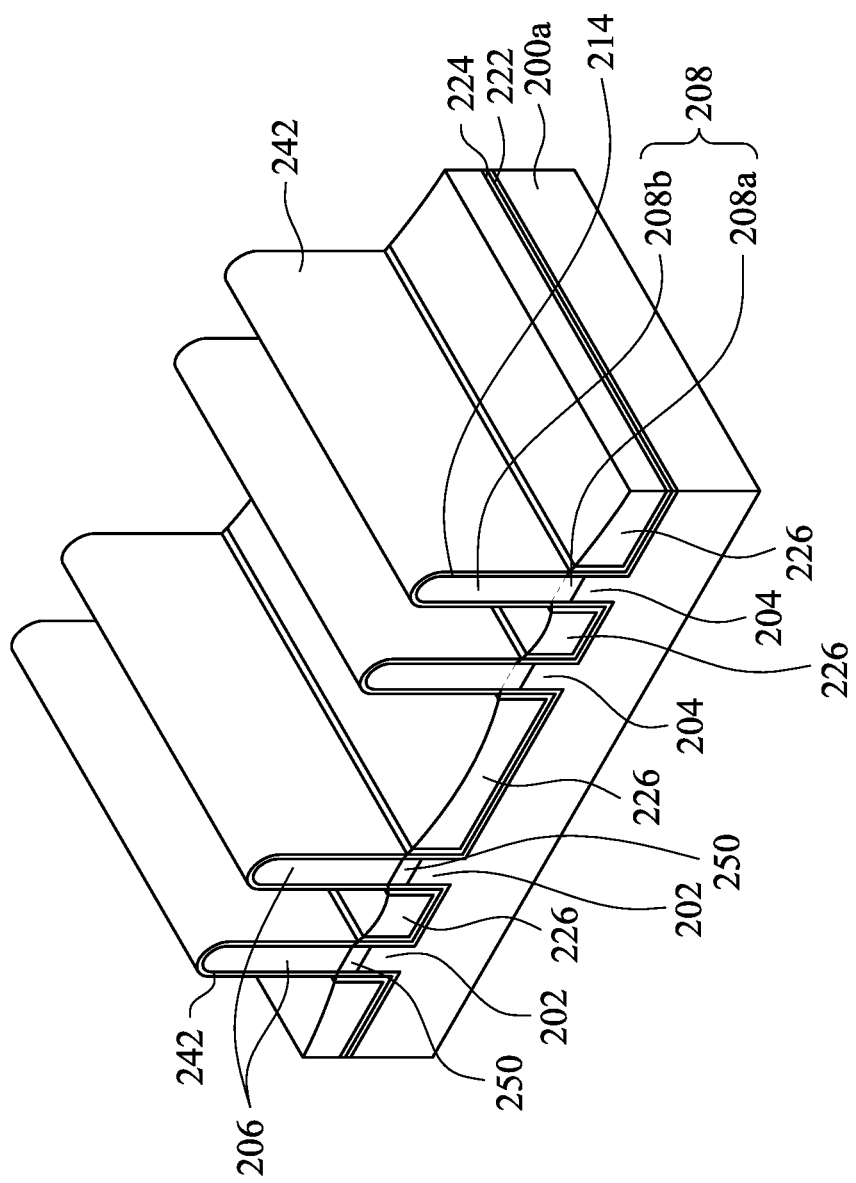
Figure 2K:
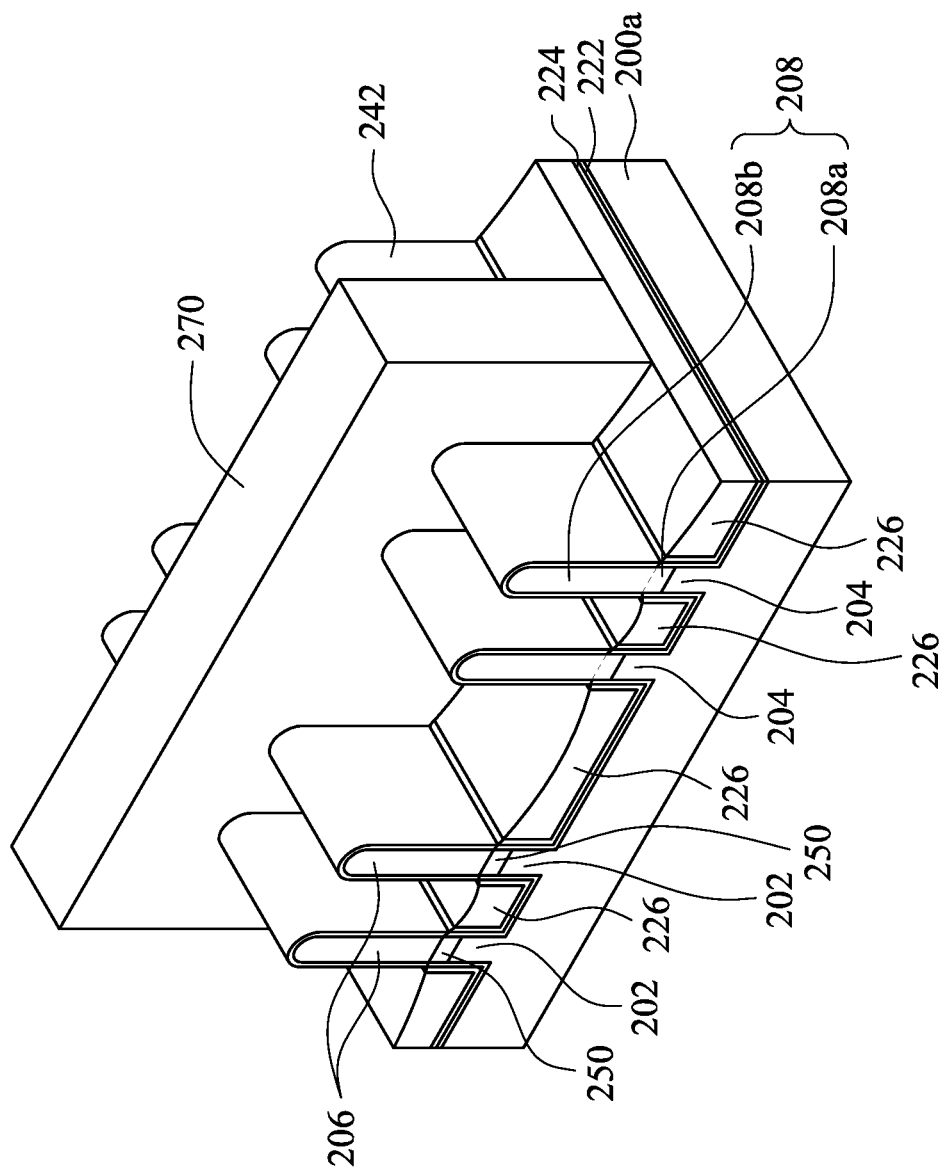
Figure 2L:
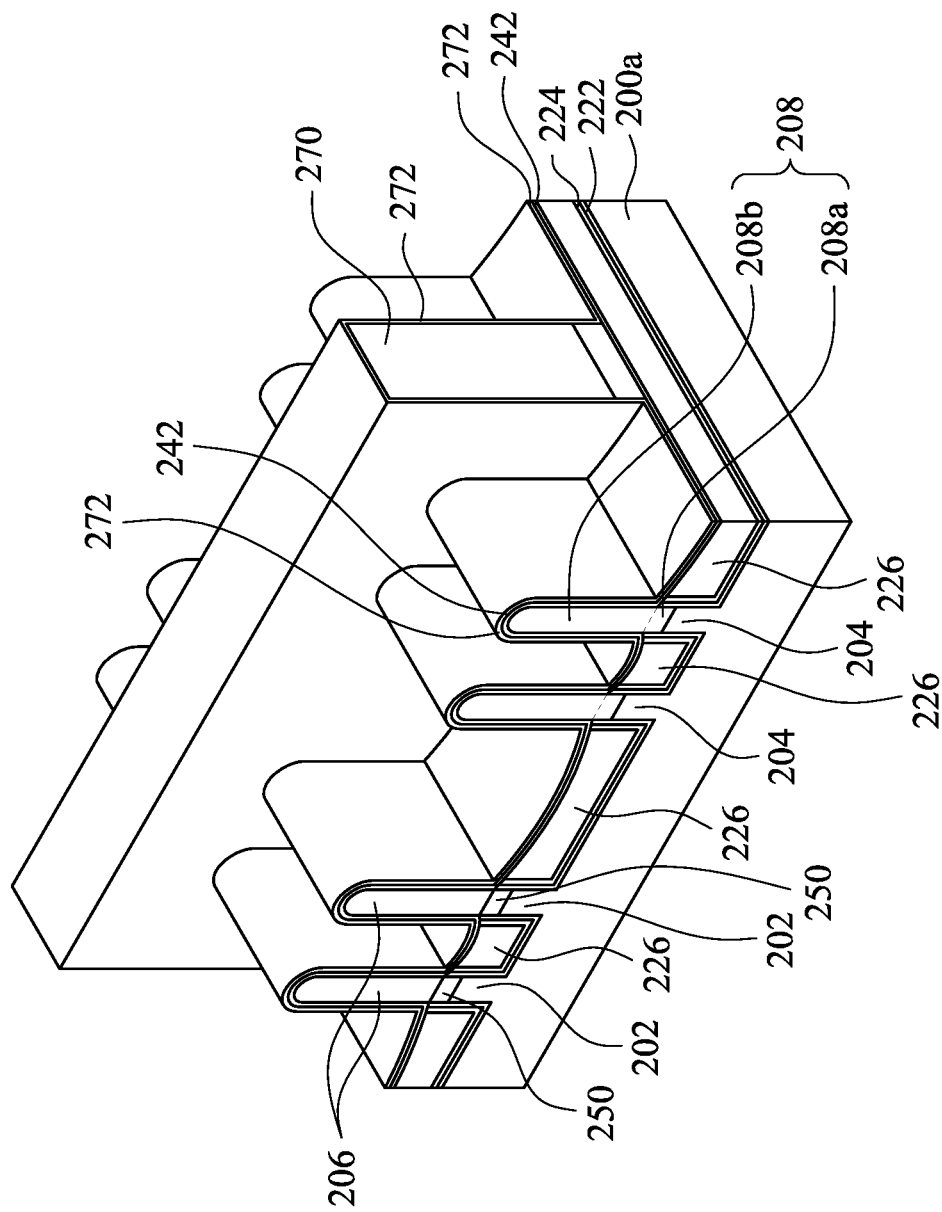
Figure 2M:
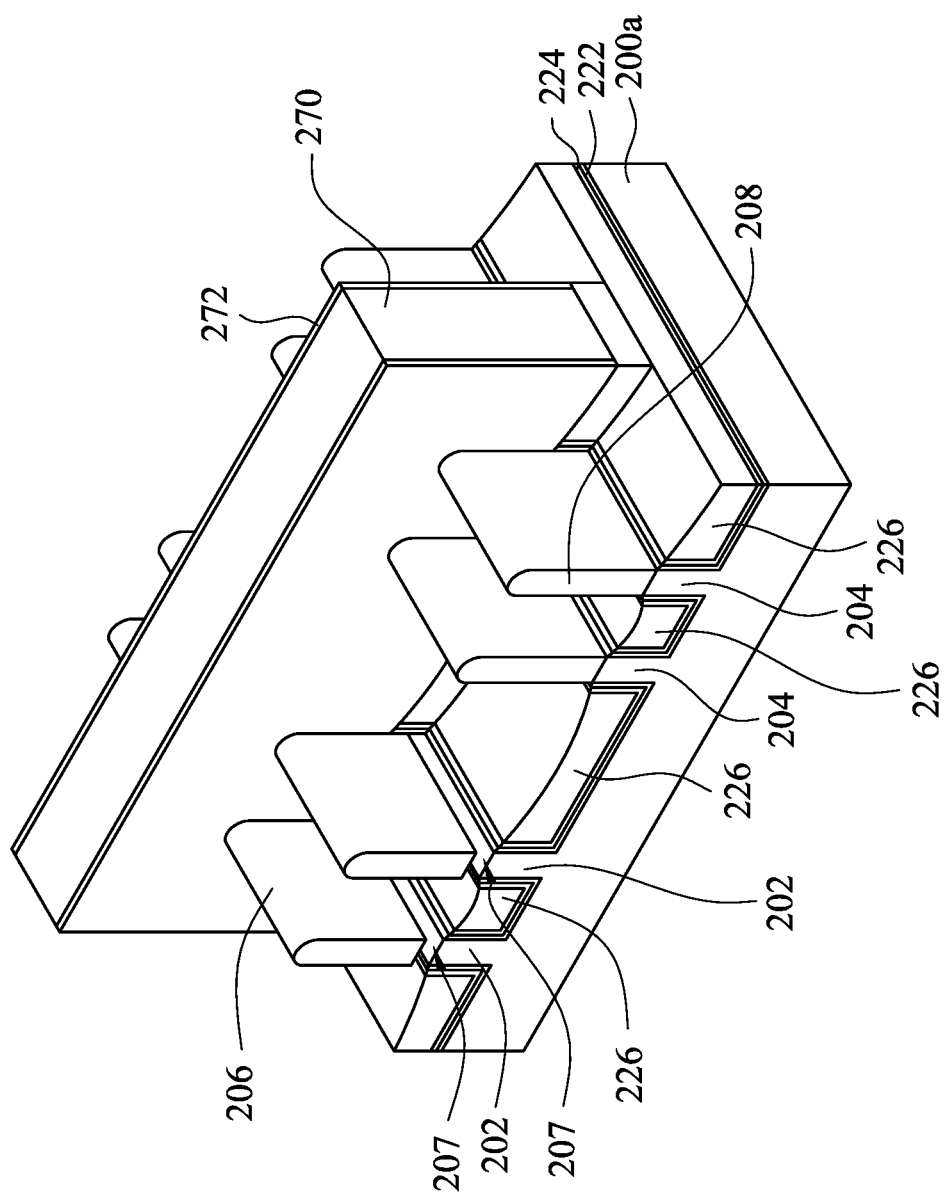
Figure 2N:
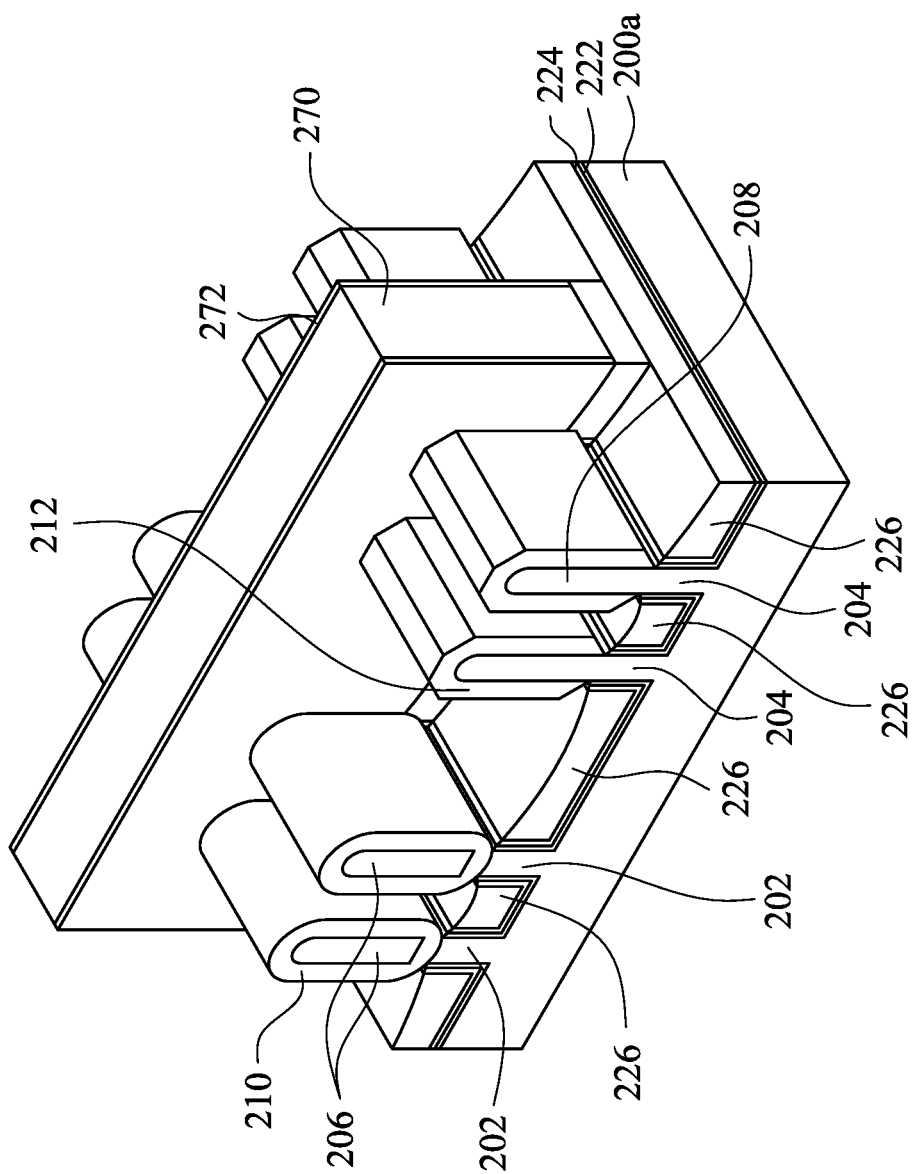
Figure 2O:
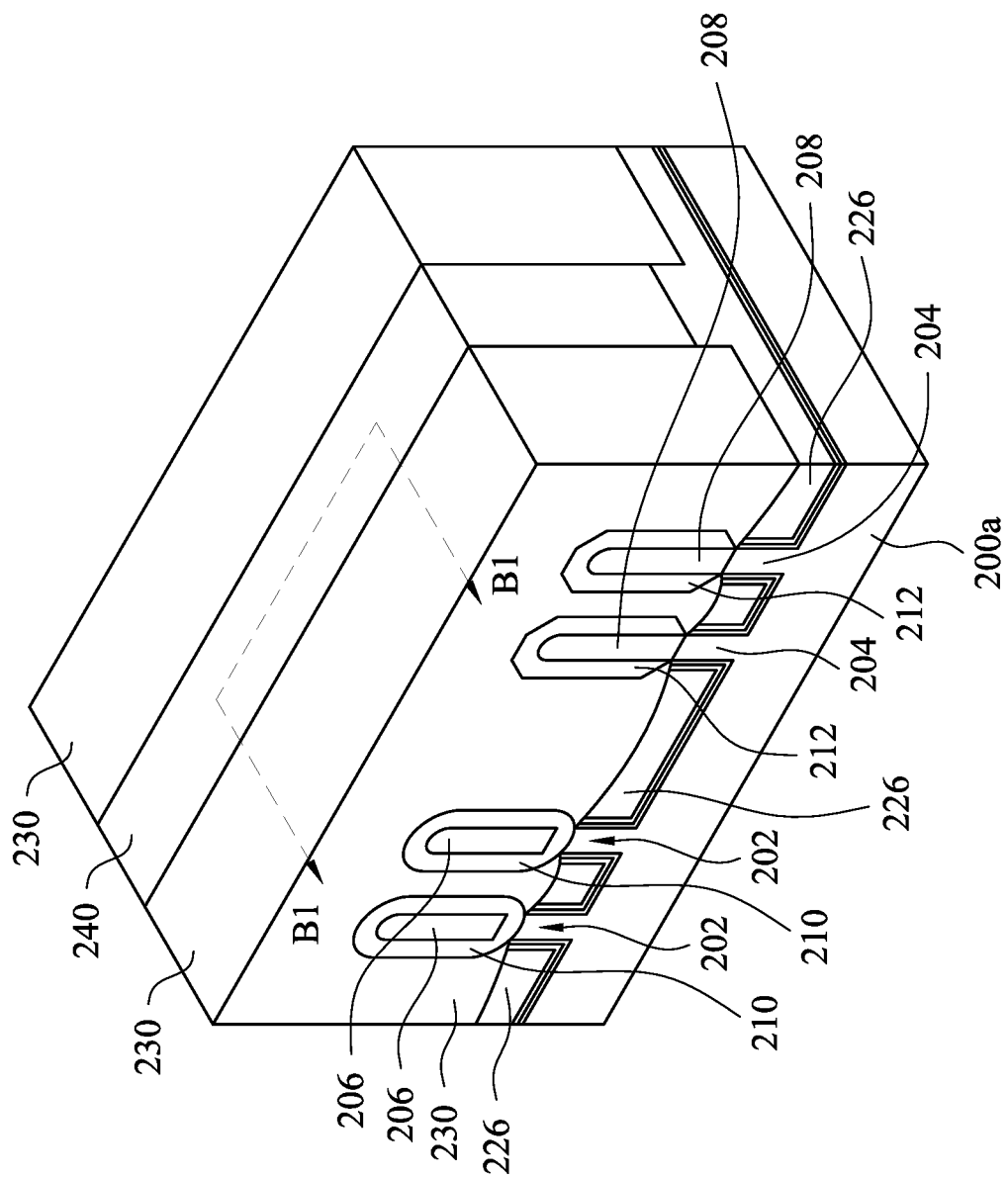
Figure 2P:
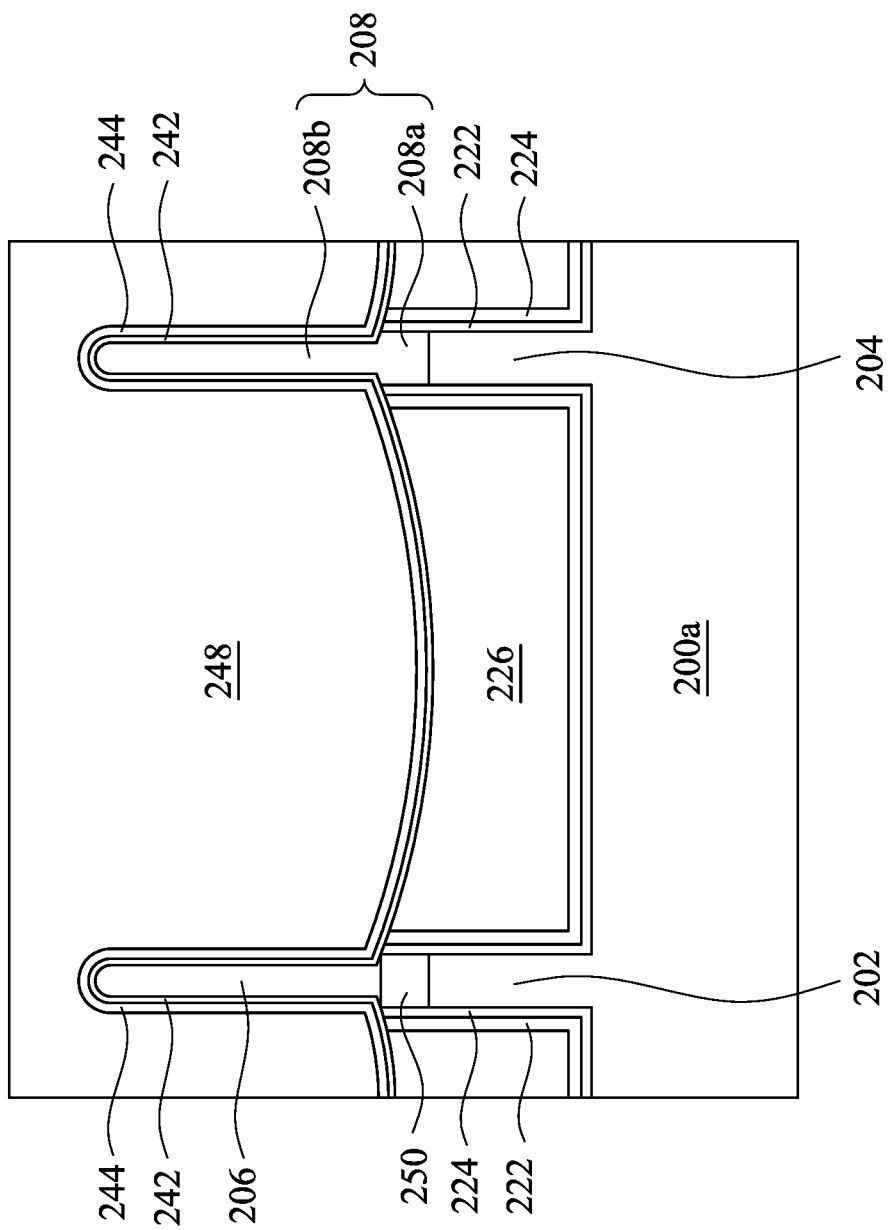
Figure 3:
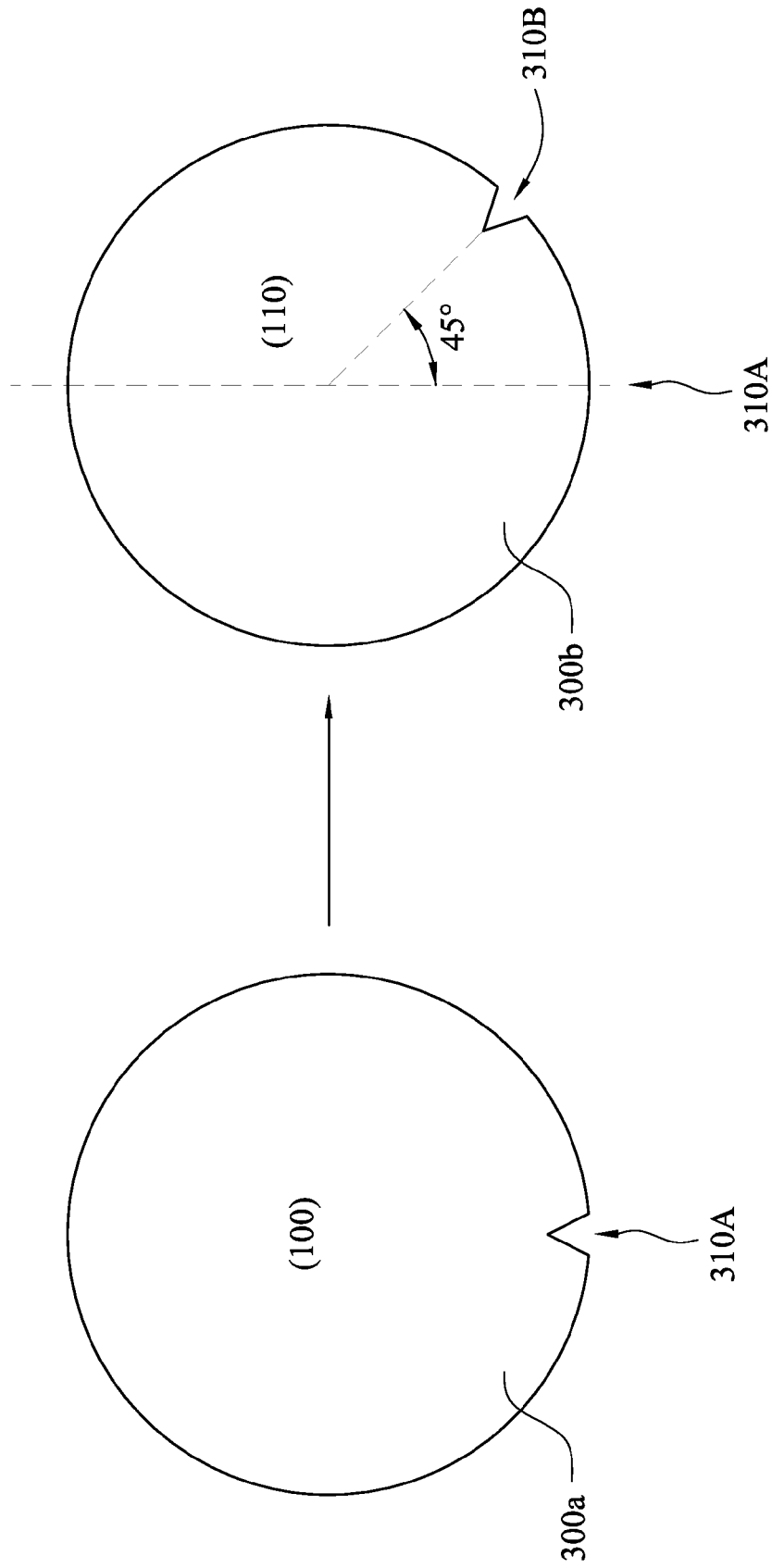
FIG. 3 is a schematic diagram for explaining a substrate rotated by 45 degrees.
Figure 4A:
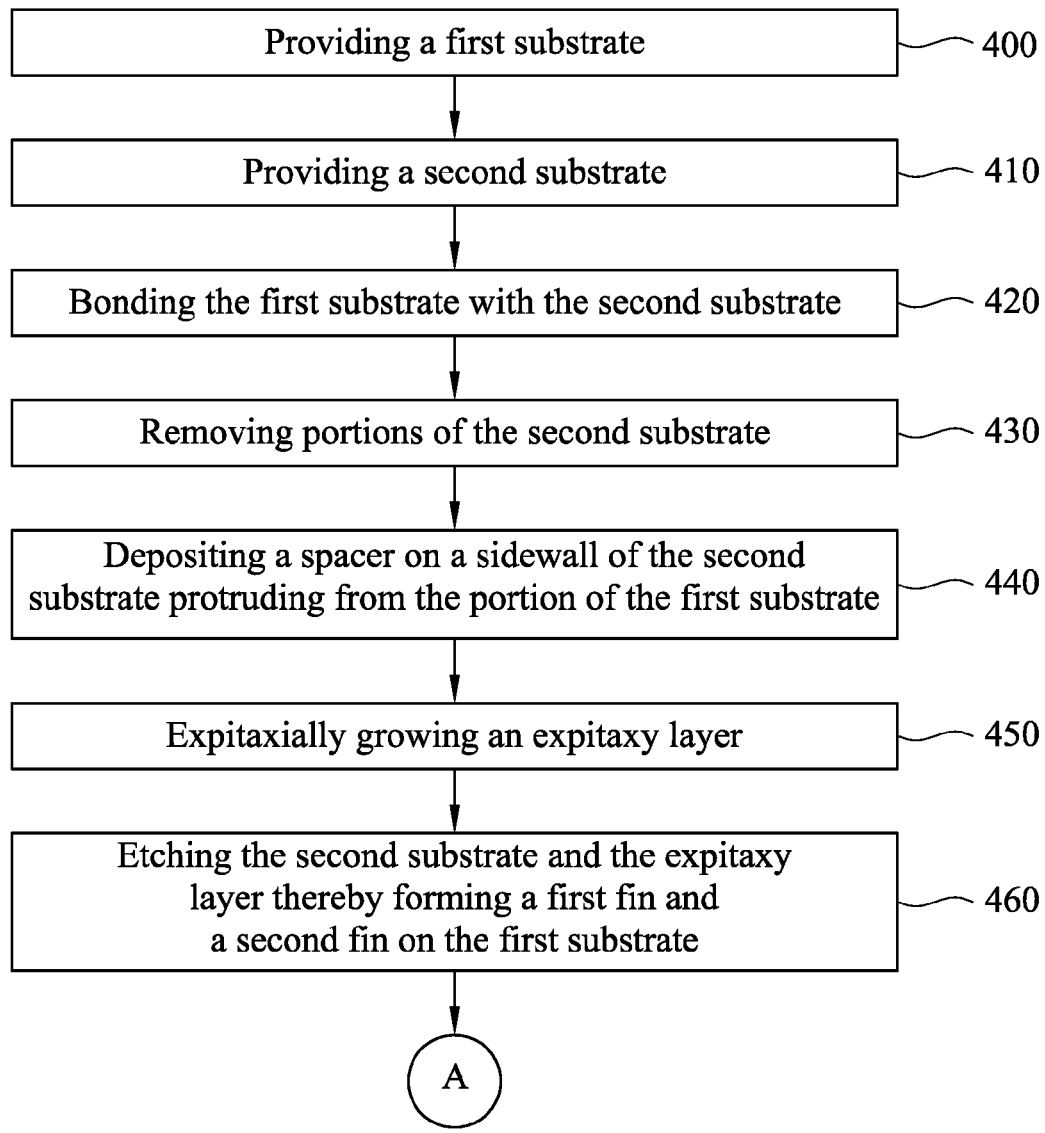
FIG. 4A and FIG. 4B illustrate a flow chart of a method of manufacturing a semiconductor device in accordance with some embodiments.
Figure 4B:
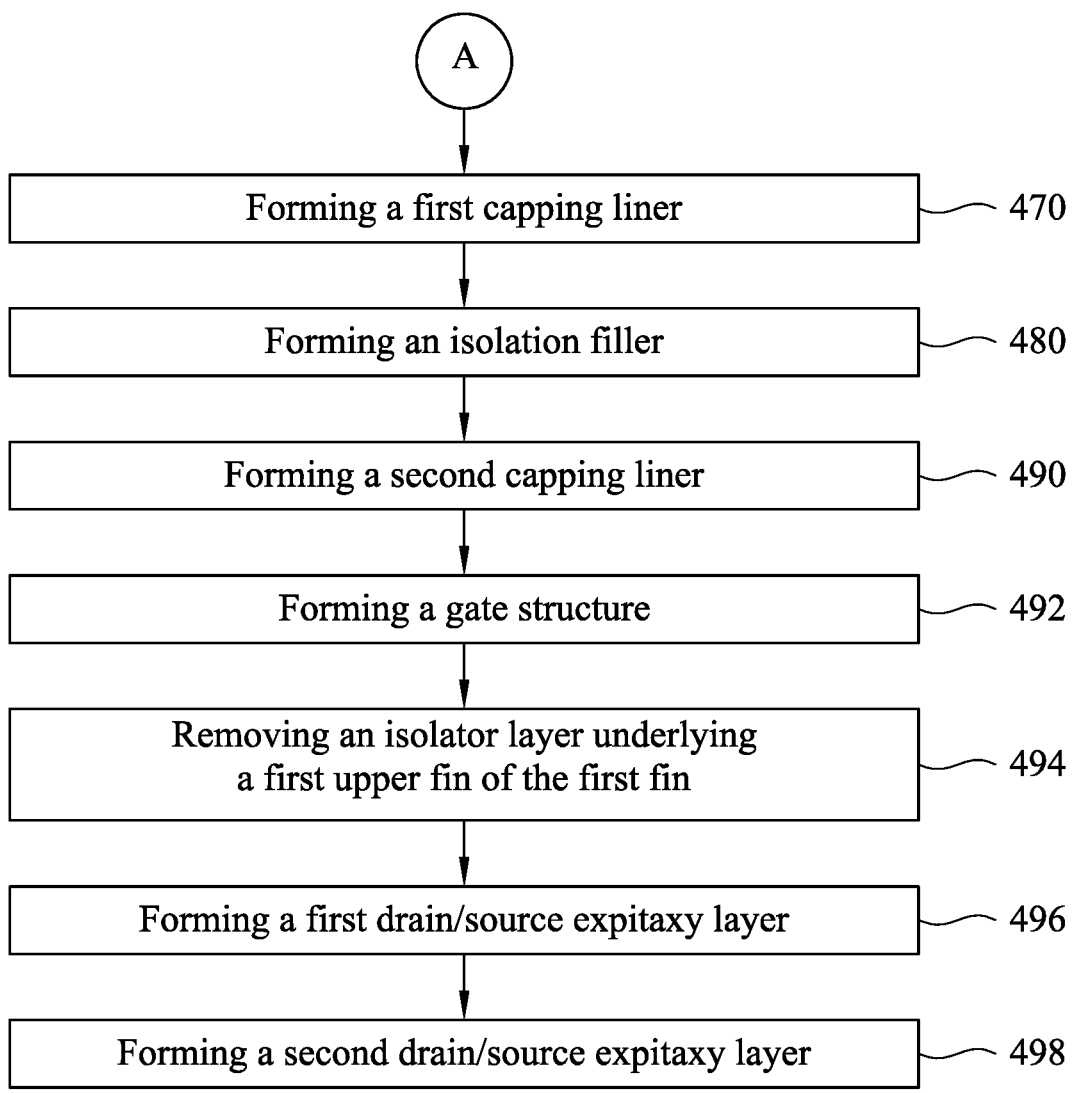

Referring to FIG. 2A to FIG. 2P, FIG. 2A to FIG. 2O are schematic cross-sectional views of intermediate stages showing a method of fabricating a semiconductor device in accordance with various embodiments, and FIG. 2P is a schematic cross-sectional views of the semiconductor device viewed along line B1-B1 of FIG. 2O. As shown in FIG. 2A, at first, a first substrate 200a having a top surface with a first crystal orientation (such as (100) crystal orientation) is provided, and a second substrate 200b having a top surface with a second crystal orientation (such as (110) crystal orientation) different from the first crystal orientation is provided. In some examples, the second substrate 200b with a (110) crystal orientation may be obtained by rotating a (100) substrate like the first substrate 200a by 45 degrees. Referring to FIG. 3, FIG. 3 is a schematic diagram for explaining a substrate rotated by 45 degrees. As shown in FIG. 3, a (100) wafer 300a has a notch at a point 310A. A wafer 300b is the (100) wafer 300a rotated by 45 degrees, and has a notch at a point 310B. Relative to the point 310A, the wafer 300b is considered as a (110) wafer.

As shown in FIG. 2A again, an first isolator layer 250a (such as silicon oxide) is formed on the first substrate 200a (such as the (100) wafer 300a), and an second isolator layer 250b (such as silicon oxide) is formed on the second substrate 200b (such as the (110) wafer 300b). In some examples, the first substrate 200a with the first isolator layer 250a a silicon-on-insulator (SOI) substrate, and the second substrate 200b with the second isolator layer 250b another silicon-on-insulator (SOI) substrate. A dual substrate bonding operation is performed to bond the first substrate 200a with the second substrate 200b via the first and second isolator layers 250a and 250b that become an isolator layer 250. After the dual substrate bonding operation, the notch (at the point 310A) of the first substrate 200a and the notch (at the point 310B) of the second substrate 200b form an angle of 45 degrees with a center of the wafer.

As shown in FIG. 2B, portions of the second substrate 200b and the isolator layer 250 on a portion of the first substrate 200b is removed by, for example, etching, and a substrate spacer 252 (such as silicon oxide) is formed on a sidewall of the second substrate protruding from the portion of the first substrate. In some embodiments, the substrate spacer 252 is formed over a top surface of the remaining portion of the second substrate 200b. Then, as shown in FIG. 2C, an expitaxy layer 253 is expitaxially grown on the portion of the first substrate 200b until a top surface of the expitaxy layer 253 is aligned with or above a top surface of the second substrate 200b. In some examples, the expitaxy layer 253 is a silicon germanium (SiGe) expitaxy layer. In this operation, the substrate spacer 252 is used prevent the growth of the expitaxy layer 253 from affecting the crystal orientation of the second substrate, especially at an interface between the expitaxy layer 253 and the second substrate 200b. For example, the second substrate 200b has a (110) crystal orientation top surface, and the expitaxy layer 253 has a (100) crystal orientation top surface.

Then, as shown in FIG. 2D, the substrate spacer 252 on a top surface of the second substrate 200b is planarized and removed by, for example, chemical-mechanical planarization (CMP). In some embodiments, a portion of the substrate spacer 252 on the sidewall of the second substrate 200b is removed by, for example, etching. Therefore, a silicon layer 254 is deposited on top surfaces of the second substrate 200b and the expitaxy layer 253. In some embodiments, the silicon layer 254 is deposited between the second substrate 200b and the expitaxy layer 253. As shown in FIG. 2E, an oxide-define (OD) operation is performed on the silicon layer 254, in which patterned hard masks 260 are formed on the silicon layer 254. The oxide-define (OD) operation may include a photolithographic operation and an etch operation. Thereafter, the remaining portion of the second substrate 200b and the expitaxy layer 253 are etched until a portion of the first substrate 200a is removed, thereby forming at least one first fin (not labelled) and at least one second fin (not labelled) on the first substrate 200b, as shown in FIG. 2F. The remaining portion of the first substrate 200a forms a first lower fin 202 and a second lower fin 204, and the remaining portion of the second substrate 200b forms a first upper fin 206, and the remaining portion of the expitaxy layer 253 forms a second upper fin. The first fin includes the first lower fin 202 and the first upper fin 206 sandwiching the remaining portion of the isolator layer 250, and the second fin includes the second upper fin 208 adjoining a top of the second lower fin 204.

As shown in FIG. 2G, a first capping liner 222 is conformally formed over sidewalls of the first lower fin 202 and the isolator layer 250, a top surface of the first substrate 200a, and sidewalls of the second lower fin 204 and the second upper fin 208. In some embodiments, a nitride layer 224 is formed over the first capping liner 222. As shown in FIG. 2H, an isolation filler 226 is deposited on the first capping liner 222 or the nitride layer 224 to cover the first lower fin 202, the isolator layer 250, the second lower fin 204 and the second upper fin 208. The isolation filler 226 may include, for example, silicon oxide, silicon nitride, silicon oxynitride, fluoride-doped silicate glass (FSG), or a low-k dielectric material. In some embodiments, the dielectric material may be formed using a flowable chemical vapor deposition (FCVD) process, a high-density-plasma (HDP) CVD process, using silane ($SiH_4$) and oxygen ($O_2$) as reacting precursors.

As shown in FIG. 2I, one or more dry or wet etching operation is performed to remove the first capping liner 222 and the nitride layer 224 covering the first upper fin 206 and the second upper fin, and to remove a portion of the isolation filler 226 until the top surface of the isolation filler 226 is substantially aligned with the top surface of the isolator layer 250, such that the second upper fin 208 has a first portion 208a and a second portion 208b adjoining a top of the first portion 208a, in which the second portion 208b of the second upper fin 208 is buried in the isolation filler 226. During the removal of the first capping liner 222 and the nitride layer 224, the first upper fin 206 and the second upper fin are also consumed, and thus widths of the first upper fin 206 and the second upper fin is smaller than widths of the first lower fin 202 and the second lower fin 204. In some examples, a width difference between the first portion 208a of the second upper fin 208 and the second portion 208b of the second upper fin 208 is substantially in a range from 1 nm to 3 nm.

As shown in FIG. 2J, a second capping liner 242 is conformally formed over the first upper fin 206 and the second portion 208b of the second upper fin 208 by deposition, thereby preventing leakage problems from occurring. In some examples, the second capping liner 242 is formed from silicon, i.e. a silicon layer. As shown in FIG. 2K, a gate structure 270 (such as a polysilicon gate structure) is formed to cross the first upper fin 206 and the second upper fin 208. As shown in FIG. 2L, a gate spacer 272 is formed by deposition to cover top surfaces and sidewalls of the gate structure 270, the first upper fin 206 and the second upper fin 208 and a top surface of the second capping liner 242. Then, as shown in FIG. 2M, portions of the gate spacer 272 and the second capping liner 242 on the isolation filler 226, the first upper fin 206 and the second upper fin 208 are removed by, for example, etching, and then the isolator layer 250 underlying the first upper fin 206 on each of both sides of the gate structure 270 is removed by, for example, etching. Thereafter, as shown in FIG. 2N, a first drain/source expitaxy layer 210 is formed to enclose the first silicon fin 206 on each of both sides of the gate structure 270, and a second drain/source expitaxy layer 212 is formed to enclose the second upper fin 208 adjoining the second lower silicon fin 204 on each of both sides of the gate structure 270. The first drain/source expitaxy layer 210 is disposed on each of both sides of the gate stack 240 on the first upper fin 206, encloses the first upper fin 206 and is disposed between the first lower fin 202 and the first upper fin 206, thereby providing good transistor performance. The first and second drain/source expitaxy layer 210 and 212 may be grown by CVD such as low pressure CVD (LPCVD), atomic layer CVD (ALCVD), ultrahigh vacuum CVD (UHVCVD), reduced pressure CVD (RPCVD), or any suitable CVD; molecular beam epitaxy (MBE) processes; any suitable epitaxial process such as selective epitaxial growth (SEG); or a combination thereof.

Subsequently, a gate replacement operation is performed to form a gate stack 240, and an isolation layer 230 is deposited to cover the first upper fin 206 and the second upper fin 208, and sandwiches the gate stack 240, as shown in FIG. 2O and FIG. 2P. In the gate stack 240, a dielectric layer (such as a high-k dielectric layer) 244 is formed over the second silicon capping layer 242, and a gate layer 248 (such as a metal gate) is formed over the dielectric layer 244.

Because the leakage caused by the poor interface state density (Dit) is serious in the first portion 208a of the upper fin 208, a thickness of the first capping liner 222 is greater than a thickness of the second capping liner 242, thereby providing sufficient protection. On the other hand, the second capping liner 242 covering the second portion 208b of the upper fin 208 covered by the gate structure 207 undergoes several operations such as the gate replacement operation, the width of the second capping liner 242 is reduced. In some examples, a thickness difference between the first capping liner 222 and the second capping liner 242 is substantially in a range from 0.5 nm to 2 nm. Moreover, a height (fin height) of the first upper fin 206 is substantially equal to a height (fin height) of the second portion 208b of the second upper fin 208, thus providing good FinFET performance.

Hereinafter, a CMOS FinFET device of the present disclosure is described with reference to FIG. 2O and FIG. 2P. The CMOS FinFET includes a silicon substrate 200a having a top surface with a (100) crystal orientation; a NMOS device disposed on the silicon substrate 200a, a PMOS device disposed on the silicon substrate 200a, a trench isolation, a gate stack 240, a first drain/source expitaxy layer 210, and a second drain/source expitaxy layer 212. The NMOS device includes a first lower silicon fin 202 protruding from the silicon substrate 200a, in which the first lower silicon fin 202 has top surfaces with the (100) crystal orientation; an isolator layer 250 overlying a top of the first lower silicon fin 292; and an upper silicon fin 206 on a top of the isolator layer 250, the upper silicon fin 206 having a top surface with a (110) crystal orientation. The PMOS device includes a second lower silicon fin 204 protruding from the silicon substrate 202a, in which the second lower silicon fin 204 has top surfaces with the (100) crystal orientation; and an upper SiGe fin 208 adjoining a top of the second lower silicon fin 204, the upper SiGe fin 208 having a first portion 208a and a second portion 208b adjoining a top of the first portion 208a, in which the upper SiGe fin 208 and the second lower silicon 204 fin having top surfaces with the (100) crystal orientation, and a width of the first portion 208a is greater than a width of the second portion 208b. The trench isolation is disposed between the first lower silicon fin 202 and the second lower silicon fin 204 and surrounds the first lower fin 202 and the second lower fin 204. The trench isolation includes a first silicon capping liner 222 conformally over sidewalls of the first lower silicon fin 202 and the isolator layer 250, sidewalls of the second lower silicon fin 204 and the first portion 208a of the upper SiGe fin 208, and top surfaces of the silicon substrate 200a; and an isolation filler 226 peripherally enclosed by the first silicon capping liner 222; and a second silicon capping liner 242 disposed conformally over the upper silicon fin 206, the upper SiGe fin 208 and a top surface of the trench isolation. The gate stack 240 crosses the upper silicon fin 206 and the upper SiGe fin 208. The first drain/source expitaxy layer 210 is disposed on each of both sides of the gate stack 240 on the upper silicon fin 206, in which the first drain/source expitaxy layer 210 encloses the upper silicon fin 206 and is disposed between the first lower silicon fin 202 and the upper silicon fin 206. The second drain/source expitaxy layer 212 is disposed each of both sides of the gate stack 240 on the upper SiGe fin 208, in which the second drain/source expitaxy layer 212 encloses the upper SiGe fin 208 that adjoins the second lower silicon fin 202. In the gate stack 240, a dielectric layer (such as a high-k dielectric layer) 244 is formed over the second capping layer 242, and a gate layer 248 (such as a metal gate) is formed over the dielectric layer 244.

Referring to FIG. 2A to FIG. 2N, and FIG. 4A and FIG. 4B, FIG. 4A and FIG. 4B illustrate a flow chart of a method of manufacturing a semiconductor device in accordance with some embodiments. In operation 400, a first substrate 200a having a top surface with a first crystal orientation (such as (100) crystal orientation) is provided. In operation 410, a second substrate 200b having a top surface with a second crystal orientation (such as (110) crystal orientation) different from the first crystal orientation is provided. In some examples, the first substrate 200a has a top surface with a (100) crystal orientation, and the second substrate 200b has a top surface with a (110) crystal orientation, in which the second substrate 200b with the (110) crystal orientation is obtained by rotating a (100) substrate like the first substrate 200a by 45 degrees.

In operation 420, the first substrate 200a is bonded with the second substrate 200b via an isolator layer 250, as shown in FIG. 2A. In operation 430, portions of the second substrate 200b and the isolator layer 250 on a portion of the first substrate 200a is removed, as shown in FIG. 2B. In operation 440, a substrate spacer 252 is first deposited on a sidewall of the second substrate 200b protruding from the portion of the first substrate 200a, and then, in operation 450, an expitaxy layer 253 is expitaxially grown on the portion of the first substrate 200a until a top surface of the expitaxy layer 253 is aligned with or above a top surface of the second substrate, as shown in FIG. 2C.

In operation 460, the remaining portion of the second substrate 200b and the expitaxy layer 253 are etched until another portion of the first substrate 100a is removed, thereby forming a first fin and a second fin on the first substrate, in which the first fin includes a first lower fin 202 and a first upper fin 206 sandwiching the isolator layer 250, and the second fin includes a second upper fin 208 adjoining a top of a second lower fin 204, the second upper fin 208 having a first portion 208a and a second portion 208b adjoining a top of the first portion 208b, as shown in FIG. 2F and FIG. 2I.

In operation 470, a first capping liner 222 is formed conformally over sidewalls of the first lower fin 202 and the isolator layer 250, a top surface of the first substrate 200a, and sidewalls of the second lower fin 204 and the first portion 208a of the second upper fin 208, as shown in FIG. 2I.

In operation 480, an isolation filler 226 is formed on the first substrate 200a to fill a trench defined by the first capping liner 222, as shown in FIG. 2I. In operation 490, a second capping liner 242 is formed conformally over the first upper fin 206 and the second portion 208b of the second upper fin 208, as shown in FIG. 2J. In operation 492, a gate structure 270 is formed to cross the first upper fin 206 and the second upper fin 208, as shown in FIG. 2K. In operation 494, the isolator layer 250 underlying the first upper fin 206 on each of both sides of the gate structure 270 is removed, as shown in FIG. 2M. In operation 496, a first drain/source expitaxy layer 210 is formed to enclose the first silicon fin on each of both sides of the gate structure, and in operation 498, a second drain/source expitaxy layer 212 to form to enclose the second upper fin 208 adjoining the second lower fin 204 on each of both sides of the gate structure 270, as shown in FIG. 2N.

In some embodiments, a semiconductor device includes a substrate having a top surface with a first crystal orientation; a first lower fin and a second lower fin protruding from the substrate, in which the first lower fin and the second lower fin having top surfaces with the first crystal orientation; an isolator layer overlying a top of the first lower fin; a first upper fin on a top of the isolator layer, the first upper fin having a top surface with a second crystal orientation different from the first crystal orientation; a second upper fin adjoining a top of the second lower fin, the second upper fin having a first portion and a second portion adjoining a top of the first portion, in which the second upper fin and the second lower fin having top surfaces with the first crystal orientation, and a width of the first portion is greater than a width of the second portion; a trench isolation disposed between the first lower fin and the second lower fin and surrounding the first lower fin and the second lower fin. The trench isolation includes a first capping liner disposed conformally over sidewalls of the first lower fin and the isolator layer, sidewalls of the second lower fin and the first portion of the second upper fin, and top surfaces of the substrate; and an isolation filler peripherally enclosed by the first capping liner; and a second capping liner disposed conformally over the first upper fin, the second upper fin and a top surface of the trench isolation, in which a thickness of the first capping liner is greater than a thickness of the second capping liner.

In some embodiments, a FinFET device includes a silicon substrate having a top surface with a (100) crystal orientation; a NMOS device disposed on the silicon substrate, the NMOS device including a first lower silicon fin protruding from the silicon substrate, the first lower silicon fin having top surfaces with the (100) crystal orientation; an isolator layer overlying a top of the first lower silicon fin; and an upper silicon fin on a top of the isolator layer, the upper silicon fin having a top surface with a (110) crystal orientation; a PMOS device disposed on the silicon substrate, the PMOS device including a second lower silicon fin protruding from the silicon substrate, the second lower silicon fin having top surfaces with the (100) crystal orientation; and an upper SiGe fin adjoining a top of the second lower silicon fin, the upper SiGe fin having a first portion and a second portion adjoining a top of the first portion, the upper SiGe and the second lower silicon fin having top surfaces with the (100) crystal orientation, in which a width of the first portion is greater than a width of the second portion; and a trench isolation disposed between the first lower silicon fin and the second lower silicon fin and surrounding the first lower fin and the second lower fin, the trench isolation including a first silicon capping liner conformally over sidewalls of the first lower silicon fin and the isolator layer, sidewalls of the second lower silicon fin and the first portion of the upper SiGe fin, and top surfaces of the silicon substrate; and an isolation filler peripherally enclosed by the first silicon capping liner; and a second silicon capping liner disposed conformally over the upper silicon fin, the upper SiGe fin and a top surface of the trench isolation, in which a thickness of the first capping liner is greater than a thickness of the second capping liner.

In some embodiments, a method of manufacturing a semiconductor device includes providing a first substrate having a top surface with a first crystal orientation; providing a second substrate having a top surface with a second crystal orientation different from the first crystal orientation; bonding the first substrate with the second substrate via an isolator layer; removing portions of the second substrate and the isolator layer on a portion of the first substrate; depositing a substrate spacer on a sidewall of the second substrate protruding from the portion of the first substrate; expitaxially growing an expitaxy layer on the portion of the first substrate until a top surface of the expitaxy layer is aligned with or above a top surface of the second substrate; etching the remaining portion of the second substrate and the expitaxy layer until another portion of the first substrate is removed, thereby forming a first fin and a second fin on the first substrate, in which the first fin includes a first lower fin and a first upper fin sandwiching the isolator layer, and the second fin includes a second upper fin adjoining a top of a second lower fin, the second upper fin having a first portion and a second portion adjoining a top of the first portion; forming a first capping liner conformally over sidewalls of the first lower fin and the isolator layer, a top surface of the first substrate, and sidewalls of the second lower fin and the first portion of the second upper fin; forming an isolation filler on the first substrate to fill a trench defined by the first capping liner; and forming a second capping liner conformally over the first upper fin and the second portion of the second upper fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate having a top surface with a first crystal orientation;
    a first lower fin and a second lower fin protruding from the substrate, wherein the first lower fin and the second lower fin having top surfaces with the first crystal orientation;
    an isolator layer overlying a top of the first lower fin;
    a first upper fin on a top of the isolator layer, the first upper fin having a top surface with a second crystal orientation different from the first crystal orientation;
    a second upper fin adjoining a top of the second lower fin, the second upper fin having a first portion and a second portion adjoining a top of the first portion, wherein the second upper fin and the second lower fin having top surfaces with the first crystal orientation, and a width of the first portion is greater than a width of the second portion;
    a trench isolation disposed between the first lower fin and the second lower fin and surrounding the first lower fin and the second lower fin, the trench isolation comprising:
        a first capping liner disposed conformally over sidewalls of the first lower fin and the isolator layer, sidewalls of the second lower fin and the first portion of the second upper fin, and the top surface of the substrate; and
        an isolation filler peripherally enclosed by the first capping liner; and
    a second capping liner disposed conformally over the first upper fin, the second upper fin and a top surface of the trench isolation, wherein a thickness of the first capping liner is greater than a thickness of the second capping liner.

2. The semiconductor device of claim 1, wherein the first crystal orientation is a (100) crystal orientation, and the second crystal orientation is a (110) crystal orientation.

3. The semiconductor device of claim 1, wherein the first lower fin, the second lower fin and the first upper fin are silicon fins, and the second upper fin is a silicon germanium (SiGe) fin.

4. The semiconductor device of claim 1, wherein the first capping liner and the second capping liner are silicon layers.

5. The semiconductor device of claim 1, wherein a thickness difference between the first capping liner and the second capping liner is substantially in a range from 0.5 nm to 2 nm.

6. The semiconductor device of claim 1, wherein a width difference between the first portion of the second upper fin and the second portion of the second upper fin is substantially in a range from 1 nm to 3 nm.

7. The semiconductor device of claim 1, wherein a height of the first upper fin is substantially equal to a height of the second portion of the second upper fin.

8. The semiconductor device of claim 1, further comprising:
a gate stack crossing the first upper fin and the second upper fin;
a first drain/source expitaxy layer disposed on each of both sides of the gate stack on the first upper fin, wherein the first drain/source expitaxy layer encloses the first upper fin and is disposed between the first lower fin and the first upper fin.

9. The semiconductor device of claim 8, further comprising:
a second drain/source expitaxy layer disposed each of both sides of the gate stack on the second upper fin, wherein the second drain/source expitaxy layer encloses the second upper fin that adjoins the second lower fin.

10. A fin field-effect transistor (FinFET) device, comprising:
a silicon substrate having a top surface with a (100) crystal orientation;
a NMOS (n-type metal-oxide semiconductor) device disposed on the silicon substrate, the NMOS device comprising:
a first lower silicon fin protruding from the silicon substrate, the first lower silicon fin having top surfaces with the (100) crystal orientation;
an isolator layer overlying a top of the first lower silicon fin; and
an upper silicon fin on a top of the isolator layer, the upper silicon fin having a top surface with a (110) crystal orientation;
a PMOS (p-type metal-oxide semiconductor) device disposed on the silicon substrate, the PMOS device comprising:
a second lower silicon fin protruding from the silicon substrate, the second lower silicon fin having top surfaces with the (100) crystal orientation; and
an upper SiGe fin adjoining a top of the second lower silicon fin, the upper SiGe fin having a first portion and a second portion adjoining a top of the first portion, the upper SiGe and the second lower silicon fin having top surfaces with the (100) crystal orientation, wherein a width of the first portion is greater than a width of the second portion; and
a trench isolation disposed between the first lower silicon fin and the second lower silicon fin and surrounding the first lower fin and the second lower fin, the trench isolation comprising:
a first silicon capping liner conformally over sidewalls of the first lower silicon fin and the isolator layer, sidewalls of the second lower silicon fin and the first portion of the upper SiGe fin, and the top surface of the silicon substrate; and
an isolation filler peripherally enclosed by the first silicon capping liner; and
a second silicon capping liner disposed conformally over the upper silicon fin, the upper SiGe fin and a top surface of the trench isolation, wherein a thickness of the first capping liner is greater than a thickness of the second capping liner.

11. The FinFET device of claim 10, further comprising:
a gate stack crossing the upper silicon fin and the upper SiGe fin;
a first drain/source expitaxy layer disposed on each of both sides of the gate stack on the upper silicon fin, wherein the first drain/source expitaxy layer encloses the upper silicon fin and is disposed between the first lower silicon fin and the upper silicon fin.

12. The FinFET device of claim 11, further comprising:
a second drain/source expitaxy layer disposed each of both sides of the gate stack on the upper SiGe fin, wherein the second drain/source expitaxy layer encloses the upper SiGe fin that adjoins the second lower silicon fin.

13. The FinFET device of claim 11, wherein a height of the upper silicon fin is substantially equal to a height of the second portion of the upper SiGe fin.

14. A semiconductor device, comprising:
a first substrate having a top surface with a first crystal orientation, wherein the first substrate has a first lower fin and a second lower fin;
an isolator layer overlying a top of the first lower fin;
a second substrate having a top surface with a second crystal orientation different from the first crystal orientation, wherein the second substrate is a first upper fin bonded with the first substrate via the isolator layer;
a second upper fin adjoining a top of the second lower fin, the second upper fin having a first portion and a second portion adjoining a top of the first portion, wherein the second upper fin and the second lower fin having top surfaces with the first crystal orientation, and a width of the first portion is greater than a width of the second portion;
a trench isolation disposed between the first lower fin and the second lower fin and surrounding the first lower fin and the second lower fin, the trench isolation comprising:
a first capping liner disposed conformally over sidewalls of the first lower fin and the isolator layer, sidewalls of the second lower fin and the first portion of the second upper fin, and the top surface of the substrate; and
an isolation filler peripherally enclosed by the first capping liner; and
a second capping liner disposed conformally over the first upper fin, the second upper fin and a top surface of the trench isolation, wherein a thickness of the first capping liner is greater than a thickness of the second capping liner.

15. The semiconductor device of claim 14, wherein the first crystal orientation is a (100) crystal orientation, and the second crystal orientation is a (110) crystal orientation.

16. The semiconductor device of claim 14, wherein the first lower fin, the second lower fin and the first upper fin are silicon fins, and the second upper fin is a silicon germanium (SiGe) fin.

17. The semiconductor device of claim 14, wherein the first capping liner and the second capping liner are silicon layers.

18. The semiconductor device of claim 14, wherein a thickness difference between the first capping liner and the second capping liner is substantially in a range from 0.5 nm to 2 nm.

19. The semiconductor device of claim 14, wherein a width difference between the first portion of the second upper fin and the second portion of the second upper fin is substantially in a range from 1 nm to 3 nm.

20. The semiconductor device of claim 14, further comprising:
- a gate stack crossing the first upper fin and the second upper fin;
- a first drain/source expitaxy layer disposed on each of both sides of the gate stack on the first upper fin, wherein the first drain/source expitaxy layer encloses the first upper fin and is disposed between the first lower fin and the first upper fin; and
- a second drain/source expitaxy layer disposed each of both sides of the gate stack on the second upper fin, wherein the second drain/source expitaxy layer encloses the second upper fin that adjoins the second lower fin.

\* \* \* \* \*